United States Patent
Eisenberg et al.

(10) Patent No.: US 11,171,254 B2
(45) Date of Patent: Nov. 9, 2021

(54) BIFACIAL PHOTOVOLTAIC CELL AND METHOD OF FABRICATION

(71) Applicant: SOLAROUND LTD., Jerusalem (IL)

(72) Inventors: Naftali Paul Eisenberg, Jerusalem (IL); Lev Kreinin, Bnei-Brak (IL); Ygal Eisenberg, Jerusalem (IL)

(73) Assignee: SOLAROUND LTD., Jerusalem (IL)

( * ) Notice: Subject to any disclaimer, the term of this patent is extended or adjusted under 35 U.S.C. 154(b) by 0 days.

(21) Appl. No.: 16/960,099

(22) PCT Filed: Dec. 27, 2018

(86) PCT No.: PCT/IL2018/051397
§ 371 (c)(1),
(2) Date: Jul. 6, 2020

(87) PCT Pub. No.: WO2019/135214
PCT Pub. Date: Jul. 11, 2019

(65) Prior Publication Data
US 2021/0066527 A1  Mar. 4, 2021

Related U.S. Application Data

(60) Provisional application No. 62/614,504, filed on Jan. 8, 2018.

(51) Int. Cl.
*H01L 31/18* (2006.01)
*H01L 31/068* (2012.01)
(Continued)

(52) U.S. Cl.
CPC ...... *H01L 31/0684* (2013.01); *H01L 31/0288* (2013.01); *H01L 31/02167* (2013.01);
(Continued)

(58) Field of Classification Search
CPC .......... H01L 31/0684; H01L 31/02167; H01L 31/02168; H01L 31/022425;
(Continued)

(56) References Cited

U.S. PATENT DOCUMENTS 11,075,316 B2 *  7/2021  Eisenberg ........... H01L 31/1868
2015/0017747 A1  1/2015  Lam et al.
(Continued)

FOREIGN PATENT DOCUMENTS

WO  2017/072758  5/2017

OTHER PUBLICATIONS

Kreinin et al.; "Industrially Fabricated Bifacial Si Solar Cells with n+-p-p+ Structure", Proceedings of 28th European Photovoltaic Solar Energy Conference 2013, p. 1835-1838.
(Continued)

*Primary Examiner* — Earl N Taylor
(74) *Attorney, Agent, or Firm* — Naomi Rosenman-Helfand

(57) ABSTRACT

A method of producing a bifacial photovoltaic cell is disclosed herein, the method comprising: forming a boron-containing layer on a second surface of a semiconductor substrate; forming a cap layer above the boron-containing layer; effecting simultaneously: i) deposition on the first surface and ii) diffusion into it of the phosphorous using $POCl_3$ gas phase process and iii) diffusion of the boron into the second surface of the substrate, to thereby dope the first surface with n-dopant and the second surface with boron.

22 Claims, 1 Drawing Sheet

(51) Int. Cl.
*H01L 31/0216* (2014.01)
*H01L 31/0224* (2006.01)
*H01L 31/0236* (2006.01)
*H01L 31/0288* (2006.01)

(52) U.S. Cl.
CPC .. *H01L 31/02168* (2013.01); *H01L 31/02363* (2013.01); *H01L 31/022425* (2013.01); *H01L 31/1804* (2013.01); *H01L 31/1868* (2013.01)

(58) Field of Classification Search
CPC ........... H01L 31/02363; H01L 31/0288; H01L 31/1804; H01L 31/1868; H01L 21/2252; H01L 21/2254; Y02P 70/50; Y02E 10/547
See application file for complete search history.

(56) References Cited

U.S. PATENT DOCUMENTS

2019/0109257 A1\* 4/2019 Eisenberg ........... H01L 31/1804
2021/0066527 A1\* 3/2021 Eisenberg ........... H01L 31/0288

OTHER PUBLICATIONS

Buck et al., "Industrial Screen Printed n-Type Silicon Solar Cells With Front Boron Emitter and Efficiencies Exceeding 17%"; Proceedings of 21st European Photovoltaic Solar Energy Conference 2006, p. 1264-1267.

Eisenberg et al. "Effective surface recombination of p+ layers doped using ion implantation or surface deposited B sources", [Energy Procedia 2016, 92: p. 16-23].

\* cited by examiner

BIFACIAL PHOTOVOLTAIC CELL AND METHOD OF FABRICATION

FIELD AND BACKGROUND OF THE INVENTION

The present invention, in some embodiments thereof, relates to bifacial cell fabrication and, more particularly, but not exclusively, to a method of cell structure formation on a silicon substrate with fine controllable boron doping and suppressed edge shunting.

There is considerable hope that conversion of sunlight into electricity by photovoltaic (PV) cells will provide a significant source of renewable energy in the future, thereby enabling a reduction in the use of non-renewable sources of energy, such as fossil fuels. However, to satisfy the worldwide demand for environmentally friendly renewable energy sources, the economics of the PV energy generation should be improved. Limited ability of energy generation per unit of solar cell area slows down photovoltaic cells use as a commercial source of electricity. Substitution of regular monofacial cells by bifacial cells allows increasing significantly (by 15-40%) the PV energy generation per area unit.

However, there is a strong demand for further increasing the density of PV energy generation. This can be achieved by increase of front as well as of back bifacial cell efficiencies of sunlight conversion to electricity. Indeed, the photovoltaic cells should be inexpensive in the production.

Photovoltaic cells commonly comprise a p-type or n-type silicon substrate doped on one side thereof with an n-dopant (e.g., phosphorus) so as to form a $n^+$ layer, and doped on the other side thereof with a p-dopant (e.g., aluminum or boron) so as to form a $p^+$ layer, thereby forming a $n^+$-p-$p^+$ structure (when using a p-type substrate) or an $n^+$-n-$p^+$ structure (when using an n-type substrate).

Electrical contacts are then applied to each side. Electrical contacts must cover only a small fraction of the surface area in order to avoid impeding the passage of light. Electrical contacts are typically applied in a grid pattern in order to minimize covering of the surface area. Monofacial photovoltaic cells usually have such a grid pattern on only one side of the cell, whereas bifacial photovoltaic cells have such a pattern on both sides, and can therefore collect light from any direction.

Different methods of dopant source application are known. Gas phase processes using $POCl_3$ for phosphorus deposition and $BCl_3$ or $BBr_3$ for boron deposition are commonly used. Gas diffusion may easily result in doping of inappropriate regions, such as cross-doping of two dopant types in a single area. Additional steps involving deposition of protective layers and/or etching to remove dopant from some regions may be introduced [Buck et al., "Industrial Screen Printed n-Type Silicon Solar Cell with Front Boron Emitter and Efficiencies Exceeding 17%" *Proceedings of 21st European Photovoltaic Solar Energy Conference* 2006, p. 1264-1267], which complicate cell fabrication.

Geminus™ bifacial cells line (Schmid Group) has been prepared using chemical vapor deposition (CVD) for depositing the dopant-containing film.

To date, the best results in industrial production of p-type silicon-based bifacial cells were realized using a spin-on technique to deposit a dopant source [U.S. Pat. Nos. 8,586,862 and 8,796,060].

Kreinin et al. ["Industrially Fabricated Bifacial Si Solar Cells with $n^+$-p-$p^+$ Structure" *Proceedings of 28th European Photovoltaic Solar Energy Conference* 2013, p. 1835-1838] mentions that in order to obtain high efficiency bifacial solar cells, it is desirable to achieve low effective back surface recombination (which may be facilitated in an $n^+$-p-$p^+$ structure by a back $p^+$ layer), as well as high minority carrier bulk lifetime, and describes p-type silicon-based bifacial cells using boron as a p-dopant which have an effective back surface recombination of 55-95 cm/second, and an average back to front short circuit current ratio of 0.75.

Boron is a well-known p-dopant, and has the advantage of being sufficiently soluble in silicon, thereby allowing a higher $p^+$-p barrier (in an $n^+$-p-$p^+$ structure) which is effective at reducing back surface recombination [Kreinin et al., *Proceedings of 28th European Photovoltaic Solar Energy Conference* 2013, p. 1835-1838]. However, boron diffusion is associated with considerable degradation of bulk lifetime, which reduces photovoltaic cell efficiency. This obstacle has encouraged the widespread use of aluminum as a p-dopant, although aluminum tends to be less effective than boron at reducing back surface recombination.

N-type silicon (in an $n^+$-n-$p^+$ structure) has also been used in order to reduce boron diffusion-associated degradation [Buck et al., *Proceedings of 21st European Photovoltaic Solar Energy Conference* 2006, p. 1264-1267]. Although n-type silicon is generally more resistant than p-type silicon to defects introduced by industrial processing, it is also more expensive.

Another problem in bifacial cell fabrication is that the use of different types of dopants (e.g., boron acceptor and phosphorus donor) may result in cross-doping of some regions of the wafer, especially at the edges, which can result in shunting. Techniques for avoiding edge shunting include laser edge isolation and edge etching, both of which are intended to avoid contact between the $n^+$ and $p^+$ layers.

U.S. Pat. Nos. 8,586,862 and 8,796,060 describe an intermediate step of removing a film comprising a p-dopant from the front side (i.e., the side to be n-doped) and edge of the substrate in order to reduce shunting, for example, by washing the front side with a washing solution (e.g., alcohol and water) using a spin-on method. This step may also remove the film from a 0.1 to 1 mm wide area bordering the edge of the substrate, such that the obtained $p^+$ layer of the photovoltaic cell does not cover an area bordering an edge of the substrate.

Russian Patent No. 2139601 discloses a method of manufacturing a solar cell with an $n^+$-p-$p^+$ structure, by high-temperature processing of a silicon substrate with a borosilicate film applied to the back side thereof and a phosphosilicate film applied to the front side thereof. Removal of a layer of silicon from the front side of the substrate and texturizing of the front side is then performed in one procedure. An $n^+$ layer is then formed on the front side, followed by formation of contacts.

Additional background art includes Eisenberg et al. [*Energy Procedia* 2016, 92:16-23], International Patent Application Publications WO2011/061693 and WO2011/061694, Russian Patent No. 2139601, U.S. Patent Application Publication No. 20110114152, U.S. Patent Application Publication No. 20080026550, U.S. Pat. Nos. 6,825,104, 6,552,414, 6,277,667, 6,180,869, 5,871,591, 4,989,059, German Patent No. 102007036921 and European Patent No. 1738402.

WO 2017/072758 by the present inventors describes a method for producing a bifacial photovoltaic cell which comprises of forming on a semiconductor substrate an n-dopant-containing layer, a boron-containing layer and effecting diffusion into the semiconductor substrate.

SUMMARY OF THE INVENTION

According to an aspect of some embodiments of the invention, there is provided a method of producing a bifacial photovoltaic cell, the method comprising:
 a) forming a boron-containing layer on a second surface of the semiconductor substrate;
 b) forming a cap layer above the boron-containing layer; and
 c) effecting simultaneously:
  deposition of a phosphorous-containing layer on a first surface of the substrate, using $POCl_3$ vapors as a component of gaseous phase surrounding the substrate, phosphorous diffusion from the phosphorous-containing layer into the substrate to form an n-doped layer,
  diffusion of the boron from the boron-containing layer into the semiconductor substrate.

According to a specific aspect of some embodiments of the invention formation of phosphosilicate glass on the first substrate surface in the $POCl_3$ atmosphere is effected before boron diffusion, whereas simultaneous boron and phosphorous diffusion is effecting in the gas atmosphere containing $POCl_3$.

According to an aspect of some embodiments of the invention, there is provided a bifacial photovoltaic cell prepared according to the method described herein.

According to an aspect of some embodiments of the invention, there is provided a bifacial photovoltaic cell comprising a semiconductor substrate, the substrate comprising an $n^+$ layer on a first surface thereof and a $p^+$ layer on a second surface thereof, the $n^+$ layer comprising an n-dopant and the $p^+$ layer comprising boron, wherein a surface concentration of boron in the second surface is less than $10^{20}$ atoms/cm$^3$ and a specific shunt resistance of the photovoltaic cell is at least 5,000 ohm*cm$^2$.

According to an aspect of some embodiments of the invention, there is provided a photovoltaic module comprising a plurality of the photovoltaic cell described herein, the plurality of photovoltaic cells being interconnected to one another.

According to an aspect of some embodiments of the invention, there is provided a power plant comprising the photovoltaic module described herein.

According to an aspect of some embodiments of the invention, there is provided an electric device comprising the photovoltaic cell described herein.

According to some embodiments of the invention, forming the cap layer is effected by depositing a substance selected from the group consisting of silicon oxide, silicon nitride and silicon oxynitride.

According to some embodiments of the invention, forming the cap layer is effected by DC or radio frequency sputtering.

According to some embodiments of the invention, a thickness of the cap layer is in a range of from 5 to 80 nm.

According to some embodiments of the invention, the cap layer is selected such that it not only reduces an amount of boron diffused out from the second surface but also prevents the phosphorous diffusion into this wafer side to avoid the $p^+$-layer cross doping.

According to some embodiments of the invention, the method further comprises:
 d) removing the n-doped layer from said substrate by texturizing;
 e) forming a passivating and/or antireflective coating on the second surface; and
 f) subsequently doping the first surface with an n-dopant.

According to some embodiments of the invention, the cap layer is selected such that it reduces an amount of boron removed from the second surface by the texturizing by at least 90%.

According to some embodiments of the invention, the cap layer is selected such that preventing the penetration of oxygen and water molecules and their reaction with boron containing layer before thermal diffusion processing.

According to some embodiments of the invention, the cap layer is selected such that it reduces by at least 50% a degree of oxidation of the boron-containing layer upon exposure to air.

According to some embodiments of the invention, the cap layer is selected such that it reduces by at least 50% a degree of water absorption by said boron-containing layer upon exposure to air.

According to some embodiments of the invention, the method further comprises removing the cap layer subsequently to removing the n-doped layer on the first surface by texturizing, and prior to forming the passivating and/or antireflective coating.

According to some embodiments of the invention, subsequently doping the first surface with an n-dopant is effected so as to form an $n^+$ layer characterized by a sheet resistance in a range of 70-150 Ohms.

According to some embodiments of the invention, diffusion of the boron is effected by exposure to a temperature in a range of from 850° C. to 1050° C.

According to some embodiments of the invention, forming the boron-containing layer on the second surface is effected by a technique selected from the group comprising of sputtering, ion implantation, chemical vapor deposition and physical vapor deposition.

According to some embodiments of the invention, the method further comprises forming electrical contacts on each of the first surface and the second surface.

According to some embodiments of the invention, the boron-containing layer has a greater thickness in some regions of the second surface, the method comprising selectively forming electrical contacts on the aforementioned regions of the second surface.

According to some embodiments of the invention, the semiconductor substrate is a p-type semiconductor.

According to some embodiments of the invention, the semiconductor substrate comprises silicon.

According to some embodiments of the invention, a thickness of the boron-containing layer is in a range of from 1 to 80 nm.

According to some embodiments of the invention, the boron-containing layer and conditions of the diffusion are selected such that a surface concentration of boron in the second surface is less than $3 \cdot 10^{20}$ atoms/cm$^3$.

According to some embodiments of the invention, the boron-containing layer and conditions of the diffusion are selected such that doping the second surface with boron forms a $p^+$ layer characterized by a thickness in a range of from 0.3 to 1.5 μm.

According to some embodiments of the invention, the boron-containing layer and conditions of the diffusion are selected such that doping of the second surface with boron forms a $p^+$ layer characterized by a sheet resistance in a range of from 30 to 150 Ohms.

According to some embodiments of the invention, the first surface of the photovoltaic cell is texturized.

According to some embodiments of the invention, the photovoltaic cell further comprises a passivating and/or antireflective coating on the second surface.

In some embodiments of the invention, the photovoltaic cell further comprises electrical contacts on each of the first surface and the second surface, wherein a concentration of boron in the p+ layer is greater in regions underlying the electrical contacts on the second surface.

According to some embodiments of the invention, an effective back surface recombination of the photovoltaic cell is less than 50 cm/second.

According to some embodiments of the invention, the photovoltaic cell is characterized by a front side efficiency of at least 19%.

According to some embodiments of the invention, a ratio of back side short circuit current to front side short circuit current is at least 0.8.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method of embodiments of the invention can involve performing or completing selected tasks manually, automatically, or a combination thereof. Moreover, according to actual instrumentation and equipment of embodiments of the method of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In some embodiments of the invention, one or more tasks according to some embodiments of method as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

DESCRIPTION OF SPECIFIC EMBODIMENTS OF THE INVENTION

Figure 1:
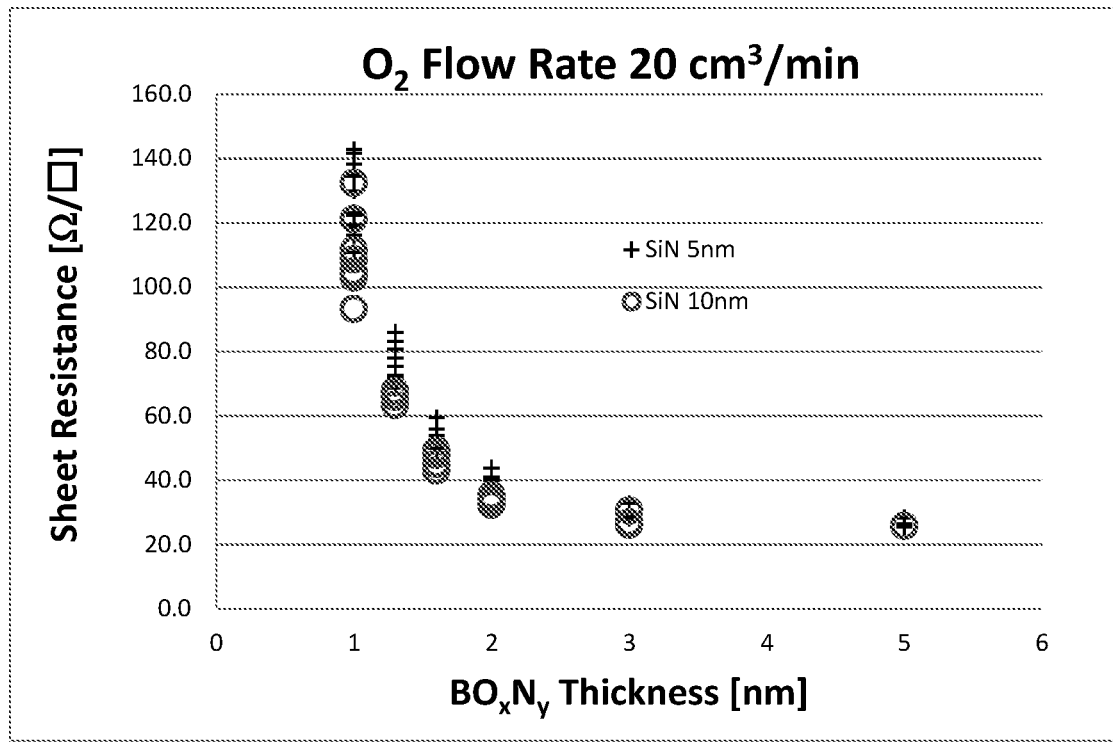
FIG. 1 is a graph showing the sheet resistance of a boron-doped p+ layer as a function of the thickness of a deposited boron-containing layer ($BO_xN_y$) used to prepare the p+ layer upon capping with a 5 and 10 nm thick layers of SiN and subsequent thermal diffusion, in accordance with some embodiments of the invention ($BO_xN_y$ layer was deposited by sputtering at an oxygen flow rate of 20 cm³/minute, and discharge power 4 kW).

The present invention, in some embodiments thereof, relates to bifacial cell fabrication and, more particularly, but not exclusively, to a method of cell structure formation on a silicon substrate with fine controllable boron doping and suppressed edge shunting.

Before explaining at least one embodiment of the invention in detail, it is to be understood that the invention is not necessarily limited in its application to the details of construction and the arrangement of the components and/or methods set forth in the following description and/or illustrated and/or the Examples. The invention is capable of other embodiments or of being practiced or carried out in various ways.

While investigating the processes for doping semiconductor substrates with boron, the present inventors have uncovered that a cap layer (e.g., formed of silicon oxide, silicon nitride, silicon oxynitride and/or other inert substance) deposited above a boron-containing layer (e.g., a source of boron dopant) enhances controllability of doping.

Without being bound by any particular theory, it is believed that the cap layer enhances stability of the boron-containing layer (which may be chemically unstable) by preventing reactions with oxygen, water and/or other atmospheric components. It is further believed that the cap layer reduces outwards diffusion of boron and undesirable cross-diffusion of n-dopant (e.g., phosphorus) over the surface as well as near the wafer edges, and/or protects the boron-doped p+ layer against etching during etching/texturizing of the opposite side.

The present inventors have further recognized that the enhanced controllability of boron-doping in the presence of a cap layer can facilitate the avoidance of over-doping the boron-doped p+ layer, which results in increased recombination losses. The present inventors have recognized that such increased recombination losses due to over-doping play a considerable role in limiting back to front short circuit current ratio in bifacial cells to about the average value of 0.75 reported by Kreinin et al. [*Proceedings of 28th European Photovoltaic Solar Energy Conference* 2013, p. 1835-1838], as well as the front efficiency to about 20-20.5%. Bulk recombination losses associated with over-doping can dominate total recombination losses, thereby rendering techniques for reducing surface recombination losses, such as surface passivation, relatively ineffective.

Embodiments of the present invention therefore relate to a novel method of producing a bifacial photovoltaic cell, which utilizes formation of a cap layer above the boron-containing layer, and effecting boron diffusion with simultaneous phosphorous deposition/diffusion for doping the first wafer side. The specific conditions and sequence of the presently described method provides a photovoltaic cell of improved efficiency.

Embodiments of the present invention further relate to a bifacial photovoltaic cell produced by a method as described herein. The bifacial photovoltaic cell is characterized, for example, by advantageously low boron concentrations (e.g., no over-doping with boron) and high shunt resistance.

The terms "semiconductor substrate", "substrate" and "wafer" are used interchangeably and have the same meaning in the context of the present invention.

According to a specific aspect of some embodiments of the invention, there is provided a method of producing a bifacial photovoltaic cell, the method comprising:

a) forming a boron-containing layer on a second surface of the semiconductor substrate, wherein the boron-containing layer is formed by sputtering boron or by boron ion implantation;

b) forming a cap layer above the boron-containing layer; and c) effecting simultaneously deposition of a phosphorous containing layer using $POCl_3$ vapors as a component of gaseous phase surrounding the substrate, diffusion of the n-dopant (phosphorous) from the phosphorous-containing layer and diffusion of the boron from the boron-containing layer into the semiconductor substrate, to thereby dope the first surface with the n-dopant and the second surface with the boron.

In some embodiments of any of the embodiments described herein, forming an n-doped layer (step (c)) is effected in two stages: first—forming the phosphorous containing layer phosphosilicate glass) in $POCl_3$ containing gaseous atmosphere at moderate temperatures and second—simultaneous diffusion of boron in second wafer side and phosphorous in the first one.

The phrase simultaneous in the meaning of step (c) of the present process refers to operations which occur in the same process stage. It is understood that at least initial deposition of the phosphorous containing layer is required before the diffusion of the n-dopant (phosphorous) commences.

Herein the phrases "n-dopant containing layer" and "boron-containing layer" encompass layers containing the indicated ingredient (e.g., phosphorous, n-dopant) and which are not part of the substrate (e.g., layers of a substance deposited onto a surface of the substrate).

In contrast, the phrase "n-doped layer" refers herein to a portion of the semiconductor substrate which has been doped with an n-dopant (e.g., upon diffusion of an n-dopant from an n-dopant containing layer into the substrate), and the phrase "boron-doped layer" refers herein to a portion of the semiconductor substrate which has been doped with boron (e.g., upon diffusion of boron from a boron-containing layer into the substrate).

The boron-containing layer and n-dopant containing layer may be formed by any suitable technique known in the art.

Examples of suitable techniques for forming a boron-containing layer include, without limitation, spin-on techniques, chemical vapor deposition (e.g., of $BCl_3$ and/or $BBr_3$), physical vapor deposition, sputtering boron and/or by boron ion implantation.

Herein and in the art, the term "sputtering" refers to a process whereby particles are ejected from a target material (e.g., a solid material) due to bombardment of the target by energetic particles (e.g., ions). As is known in the art, at least a portion of the ejected material can deposit on a surface (e.g., a surface of a substrate in a vicinity of the target) to form a layer.

Herein, the phrase "sputtering boron" and the like refer to sputtering in which the particles ejected in sputtering comprise boron.

Herein and in the art, the term "ion implantation" refers to a process in which ions (e.g., boron ions) are accelerated by an electrical field and impacted into a solid material (e.g., into a substrate described herein, according to any of the respective embodiments). When the ion velocity is sufficiently high, the ions can become embedded in the impacted material, e.g., by changing a crystal structure of the impacted solid material.

In some embodiments, suitable techniques for forming a boron-containing layer include, without limitation, spin-on techniques, chemical vapor deposition (e.g., of $BCl_3$ and/or $BBr_3$), physical vapor deposition, sputtering boron and/or by boron ion implantation.

In some embodiments a thickness of the boron-containing layer is in a range of from 1 to 80 nm (optionally from 2 to 80 nm). In some such embodiments, the thickness of the deposited layer is in the range of from 1 to 40 nm (optionally from 2 to 40 nm). In some such embodiments, the thickness of the deposited layer is in the range of from 1 to 20 nm (optionally from 2 to 20 nm). In some such embodiments, the thickness of the deposited layer is in the range of from 1 to 10 nm (optionally from 2 to 10 nm).

In some embodiments a thickness of the boron-containing layer is selected such that the boron-containing layer contains an amount of boron (per surface area) which is suitable for providing a desired concentration of boron in a $p^+$ layer (according to any of the respective embodiments described herein) after effecting diffusion of boron (according to any of the respective embodiments described herein).

For any given composition of the boron-containing layer, a thickness (of the boron-containing layer) may readily be selected so as to provide a desired boron concentration.

In some embodiments described herein, forming a boron-containing layer is effected such that a thickness of the boron-containing layer and/or concentration of boron in the layer are greater in selected regions of the second surface, the selected regions being intended for being under electrical contacts (which are optionally applied as described herein).

It is to be appreciated that selected regions having a greater amount of boron (e.g., formed by selective formation of a boron-containing layer in such regions alone) are not to be considered as part of a boron-containing layer when determining a variability of an amount of boron in a boron-containing layer.

In some embodiments of the present invention, the method further comprises removing the n-doped layer (e.g., an $n^+$ layer) on the first surface (also referred to herein as a "first n-doped layer" or "first $n^+$ layer"), optionally by etching (e.g., by texturizing the first surface), and subsequently doping the first surface with an n-dopant, thereby forming a second n-doped layer (e.g., a second $n^+$ layer). In some embodiments, n-dopant (if present) is also removed from the second surface by a process (e.g., etching) which removes the n-dopant more effectively than the boron (e.g., in any embodiments described herein wherein n-dopant deposition on the second surface is not prevented by a cap layer).

In some embodiments, removing the n-doped layer (e.g., an $n^+$ layer) on the first surface is effected so as to concomitantly remove any n-doped layer (e.g., n-doped islands) present elsewhere.

In some embodiments, etching (e.g., of an n-doped layer) is effected by an alkaline solution (e.g., a solution that comprises sodium hydroxide).

The second n-doped layer may optionally be formed by any suitable technique known in the art for n-doping (e.g., any n-doping technique described herein), including, without limitation, gas phase diffusion, ion implantation, and/or use of an n-dopant containing layer (e.g., according to any of the respective embodiments described herein).

Herein, in embodiments wherein a first n-doped layer and second n-doped layer are formed, the phrases "n-doped layer" and "n⁺ layer" refers to the first n-doped layer, unless indicated otherwise.

In some embodiments of the present invention a second n⁺ layer prepared according to any of the respective embodiments described herein, is characterized by a sheet resistance in a range of from 70 to 150 Ohms/□.

As used herein and in the art, the term "Ohms" in the context of a sheet resistance is interchangeable with the terms "Ohms per square" and "Ohms/□", an accepted unit of sheet resistance which is used in the art to differentiate units of sheet resistance from units of resistance of a bulk material (although Ohm units and Ohm per square units are dimensionally equal).

In some embodiments, a second n⁺ layer prepared according to any of the respective embodiments described herein has a greater sheet resistance than the first n⁺ layer.

In some embodiments of the present invention, a first n⁺ layer which is removed according to any of the respective embodiments described herein is characterized by a sheet resistance of less than 70 Ohms, optionally less than 40 Ohms, for example, in a range of from 8 to 25 Ohms.

In some embodiments described herein, the method further comprises forming a passivating and/or antireflective coating on the second surface, preferably after removal of the cap layer and boron-containing layer. In some such embodiments, forming a passivating and/or antireflective coating on the second surface is effected prior to, concomitantly with, and/or subsequently to removing of a first n-doped layer according to any of the respective embodiments described herein.

According to some embodiments the method of the present invention further comprises:

d) removing the n-doped layer from the substrate by texturizing;

e) forming a passivating and/or antireflective coating on the second surface; and f) subsequently doping said first surface with an n-dopant.

wherein forming a passivating and/or antireflective coating (step (e)) may be effected at any stage, e.g., prior to step (d), between step (d) and step (f) and subsequent to step (f).

In some embodiments, doping the first surface with an n-dopant to form a second n⁺ layer (e.g., step (f)) according to any of the respective embodiments described herein is effected subsequently to forming the passivating and/or antireflective coating on the second surface (e.g., step (e)). In some such embodiments, forming the passivating and/or antireflective coating (e.g., step e)) is effected subsequently to effecting removal of a first n-doped layer (e.g., step (d)) according to any of the respective embodiments described herein, e.g., so as not to interfere with removal of the first n-doped layer.

In some embodiments of the invention, texturizing is carried out in order to remove an n-doped layer from the substrate and/or texturize the substrate and/or prevent shunting at the substrate edges.

According to some embodiments of the invention, the method further comprises removing the cap layer subsequently to removing the n-doped layer on the first surface by texturizing, and prior to forming the passivating and/or antireflective coating.

Herein, a "passivating and/or antireflective coating" refers to one or more dielectric coatings, each of which has a passivating effect and/or an antireflective effect.

Forming a passivating coating according to any of the respective embodiments described herein may optionally comprise (and optionally consist of) forming a SiB layer according to any of the respective embodiments described herein.

Herein, the term "SiB" refers to a combination of silicon and boron atoms, wherein a concentration of the boron atoms exceeds the solubility of boron atoms in at diffusion temperature (up to about 1100° C.), e.g., above about $5 \cdot 10^{20}$ atoms/cm³. The term "SiB" is not intended to imply a 1:1 stoichiometry of Si to B.

SiB may optionally be identified as a substance in which an absolute concentration of boron atoms (e.g., as determined by secondary ion mass spectrometry (SIMS)) is significantly greater than a concentration of electrically active (i.e., dissolved) boron atoms (e.g., as determined by electrochemical capacitance-voltage profiling (ECV)).

Additional examples of a passivating coating according to any of the respective embodiments described herein include, without limitation, layers of aluminum oxide (e.g., $Al_2O_3$) and/or silicon oxide.

A passivating and/or antireflective coating (e.g., an aluminum oxide, silicon oxide, silicon nitride and/or silicon oxynitride coating) may optionally be deposited (e.g., using sputtering and/or chemical vapor deposition) and/or formed by a reaction on the substrate surface, for example, by chemical and/or thermal oxidation of silicon in the substrate to form silicon oxide and/or diffusion of boron into silicon to form SiB (e.g., as described herein). The passivating and/or antireflective may have any suitable thickness (e.g., according to any of the respective embodiments described herein).

The terms "silicon nitride" and "SiN", which are used herein interchangeably, refer herein to a family of substances composed substantially of silicon and nitrogen, with various stoichiometries of Si and N (e.g., $Si_3N_4$), although some amounts of additional atoms (e.g., hydrogen) may be present as impurities.

The phrase "silicon oxynitride" refers to $SiN_xO_y$, wherein each of x and y is a positive number of up to 2 (e.g., between 0.1 and 2), and x and y are in accordance with the valence requirements of Si, N and O. Some amounts of additional atoms (e.g., hydrogen) may be present as impurities.

In some embodiments, the passivating and/or antireflective coating is formed such that a border of the passivating and/or antireflective coating corresponds to a desired border of a subsequently formed second n-doped layer (according to any of the respective embodiments described herein). The passivating and/or antireflective coating may optionally determine the border of a second n-doped layer by preventing n-doping across the border (i.e., in a region covered by the passivating and/or antireflective coating), for example, facilitating separation (i.e., reducing overlap) of an n-doped layer and a boron-doped layer, which can enhance shunt resistance.

In some embodiments, forming the passivating and/or antireflective coating is effected such that the passivating and/or antireflective coating covers an edge of the substrate (i.e., a surface between the first surface and the second surface, which is optionally perpendicular to each of the first surface and second surface), and optionally covers all of the edges of the substrate. In some such embodiments, the passivating and/or antireflective coating prevents formation of a second n-doped layer (according to any of the respective embodiments described herein) on an edge of the substrate.

In some embodiments of any of the embodiments described herein, diffusion of the n-dopant and diffusion of the boron are effected simultaneously. In some embodiments, simultaneous diffusion of n-dopant and boron are effected by heating, optionally by exposure to a temperature in a range of from 850° C. to 1050° C.

In some embodiments of the present invention, the boron-containing layer (e.g., the thickness, boron-concentration, and composition of the layer) and conditions of diffusion (e.g., temperature and/or time of diffusion) are selected such that a concentration of boron in said second surface is less than $10^{21}$ atoms/cm$^3$, optionally less than $3 \cdot 10^{20}$ atoms/cm$^3$, optionally less than $10^{20}$ atoms/cm$^3$, optionally less than $3 \cdot 10^{19}$ atoms/cm$^3$ and optionally less than $10^{19}$ atoms/cm$^3$.

Herein, a concentration at a surface of a substrate, in units of amount (e.g., atoms) per volume (e.g., cm$^3$ units) refers to a maximal concentration in a doped layer of the substrate (e.g., a maximal concentration at any depth up to a depth of about 1 µm).

In some embodiments the boron-containing layer (e.g., the thickness, boron-concentration, and composition of the layer) and conditions of diffusion (e.g., temperature and/or time of diffusion) are selected such that doping the second surface with boron forms an p$^+$ layer characterized by a sheet resistance according to any of the respective embodiments described herein, e.g., in a range of from 15 to 300 ohms, from 30 to 300 ohms, from 30 to 200 ohms and/or from 30 to 150 ohms.

The skilled person will be readily capable of modulating conditions (e.g., temperature and/or duration of thermal treatment, and/or amount of dopant in a dopant-containing layer) to arrive at a desired amount (e.g., concentration) of dopant (e.g., boron) and/or sheet resistance (which is affected by amount of dopant) in a surface of the substrate, according to any of the respective embodiments described herein.

In some embodiments wherein a boron-containing layer is formed prior to an n-dopant-containing layer, the method further comprises etching the first surface subsequent to formation of the boron-containing layer and prior to formation of the n-dopant-containing layer. In some embodiments, such etching is performed so as to remove any boron-containing layer present on the first surface. In some such embodiments, the method further comprises forming a cap layer (according to any of the respective embodiments described herein) above the boron-containing layer on the second surface, for example, a cap layer selected to protect the boron-containing layer on the second surface during etching of the first surface.

In some embodiments the method further comprises forming an area on an edge (i.e., adjoining the edge) of the second surface which is substantially devoid of boron, the area having a width in a range of 0.1-0.5 mm.

In some embodiments, the boron-containing layer does not reach any edge of the second surface.

The abovementioned area on an edge of the surface may optionally be obtained by masking the area when forming a boron-containing layer and/or by etching the area subsequent to forming the boron-containing layer (e.g., to remove the boron-containing area from the area).

In some embodiments, etching the area on the edge is effected by reactive ion etching. The etching may optionally be effected using a mask configured to etch only a narrow (e.g., 0.1 to 0.5 mm wide) area of the second surface.

In some embodiments, etching the area on the edge is effected prior to effecting diffusion of boron (e.g., step (c) as described herein), for example, to avoid any long-term effect of the boron-containing layer being even temporarily present at the edge of the surface prior to etching.

In some embodiments of any of the embodiments described herein, the method further comprises forming electrical contacts on each of the first surface and the second surface. Electric contacts may be formed according to methods well known in the art.

In order to allow light to reach the substrate of a bifacial photovoltaic cell, the contacts on both surfaces are preferably configured so as to allow most of the light to pass through to the substrate, thereby allowing the photovoltaic cell to produce electricity from illumination on either side of the cell. For example, the contacts may optionally be configured in a grid pattern.

In some embodiments, contacts are selectively formed (optionally using a mask) on regions of the second surface which have a greater concentration of boron than the rest of the second surface. In some embodiments, such regions are formed using a boron-containing layer which has a greater thickness and/or concentration in such regions (according to any of the respective embodiments described herein).

According to an aspect of some embodiments of the invention there is provided a bifacial photovoltaic cell prepared by the method of any one of respective embodiments described herein.

Cap Layer:

In some embodiments of the invention, a thickness of the cap layer is in a range of from 2.5 to 80 nm. In some embodiments, the thickness is in a range of from 5 to 40 nm. In some embodiments, the thickness is in a range of from 5 to 20 nm.

Herein, the terms "cap" and "capping" refer to a layer being above ("capping") a boron-containing layer (i.e., farther from the substrate than the boron-containing layer), and are not intended to be further limiting.

In some embodiments forming the cap layer is effected immediately after forming the boron-containing layer.

The cap layer may be formed according to any suitable technique known in the art for forming a cap layer according to any of the respective embodiments described herein. Examples of suitable techniques include, without limitation, sputtering (e.g., DC sputtering and/or radio frequency sputtering), physical vapor deposition and chemical vapor deposition.

Herein and in the art, "radio frequency sputtering" refers to sputtering whereby a sputtering target may optionally be subjected to a charged plasma particles, such as ionized gas (optionally using strong electric and/or magnetic fields to direct plasma particles in the general location of the target), with an alternating voltage bias (e.g., alternating at a radio frequency, such as 13.56 MHz) accelerating the plasma particles.

Herein and in the art, "DC sputtering" refers to sputtering whereby ions in a plasma are directed towards a sputtering target (to thereby bombard the target). Accelerated ions in the plasma are optionally neutralized (by an electron source) such that the target is bombarded by neutrally charged particles.

The thickness of a cap layer may be controlled, for example, by controlling the duration of a deposition process (e.g., duration of sputtering). Control over the thickness of the cap layer may optionally be utilized to allow control over properties of the cap layer, for example, permeability to boron, n-dopant and/or etching solution.

In some embodiments the cap layer comprises an inert substance. The cap layer is optionally formed by deposition of a layer of the inert substance, optionally by sputtering (e.g., DC and/or radio frequency sputtering).

Examples of inert substances suitable for forming a cap layer include, without limitation, silicon nitride, silicon oxynitride and silicon oxide.

In some embodiments of the present invention the selection of a cap layer having certain properties (according to any of the respective embodiments described herein), may optionally be by effecting formation of a cap layer having a thickness sufficient to result in the indicated properties, for example, a thickness of at least 5 nm (optionally up to 30 nm, according to any of the respective embodiments described herein). Alternatively or additionally, selection may optionally be effected by comparing results of different cap layer compositions (e.g., silicon nitride, silicon oxide and/or silicon oxynitride) and/or different methodologies of cap layer formation (according to any of the respective embodiments described herein).

In some embodiments forming a cap layer above the boron-containing layer is effected prior to effecting diffusion (e.g., by thermal treatment). In some embodiments, forming the cap layer above the boron-containing layer is effected prior to deposition of phosphorus-containing (n-dopant-containing) layer. In such embodiments, the cap layer protects the boron-containing layer (e.g., until diffusion is effected).

In some embodiments according to any of the embodiments described herein, the cap layer is selected such that it reduces an amount of boron removed from the second surface by texturizing (according to any of the respective embodiments described herein), for example, wherein texturizing of the first surface is associated with a small degree of etching of the second surface. Without being bound by any particular theory, it is believed that substrate surfaces heavily doped (e.g., over-doped) with boron are not only relatively resistant to texturization processes, but modest removal of boron upon texturing also has relatively little effect on the properties of heavily boron-doped surfaces, whereas surfaces with relatively low boron concentrations (e.g., no more than $3\cdot 10^{20}$ atoms per $cm^3$, according to any of the respective embodiments described herein) would be more adversely effected by boron removal upon texturization (e.g., if not reduced by a cap layer).

In some embodiments the method further comprises removing the cap layer according to any of the respective embodiments described herein subsequently to removal of an n-doped layer by texturizing (according to any of the respective embodiments described herein), optionally prior to forming a passivating and/or antireflective coating according to any of the respective embodiments described herein. Removal of the cap layer can be carried out by means and methods known to the skilled person in the art, for example by chemical means, including but not limited to the use of an HF solution. In some such embodiments, the cap layer protects the boron-doped layer from the texturizing process.

In some embodiments described herein, the cap layer is selected such that it reduces a degree of oxidation (e.g., upon exposure to air) of a boron-containing layer (according to any of the respective embodiments described herein) under the cap layer (i.e., in comparison to a degree of oxidation of a corresponding boron-containing layer, under the same conditions, in the absence of the cap layer). In some embodiments relating to reduced oxidation, a reduced degree of oxidation is a reduced rate of oxidation, and/or oxidation is determined at a pre-determined time after formation of the boron-containing layer and/or cap layer (e.g., 1 hour or 24 hours after cap layer formation).

In some embodiments the cap layer is selected such that it reduces a degree of water absorption (e.g., upon exposure to air under pre-determined conditions, e.g., 20° C. and 100% humidity) by a boron-containing layer (according to any of the respective embodiments described herein) under the cap layer (i.e., in comparison to a degree of water absorption by a corresponding boron-containing layer, under the same conditions, in the absence of the cap layer).

Without being bound by any particular theory, it is believed that boron-containing layers suitable for doping a substrate with relatively low boron concentrations (e.g., no more than $3\cdot 10^{20}$ atoms per $cm^3$, according to any of the respective embodiments described herein), especially very thin boron-containing layers (e.g., 1 to 35 nm thick, according to any of the respective embodiments described herein) may be relatively sensitive to reactions with the surrounding atmosphere (e.g., oxidation, water absorption). It is further believed that protection of the boron-containing layer by the cap layer against the atmosphere may enhance reproducibility of the boron-doping.

In some embodiments described herein, the cap layer is selected such that it reduces an amount of boron which escapes into the surrounding atmosphere upon effecting diffusion of boron according to any of the respective embodiments described herein (i.e., in comparison to an amount of boron which escapes into the surrounding atmosphere, under the same conditions, in the absence of the cap layer).

In some embodiments, the cap layer is selected such that no more than 5% of boron in the boron-containing layer escapes into the surrounding atmosphere upon effecting the diffusion of said boron. In some embodiments, the cap layer is selected such that no more than 3% of boron in the boron-containing layer escapes into the surrounding atmosphere upon effecting the diffusion of said boron. In some embodiments, the cap layer is selected such that no more than 2% of boron in the boron-containing layer escapes into the surrounding atmosphere upon effecting the diffusion of said boron. In some embodiments, the cap layer is selected such that no more than 1% of boron in the boron-containing layer escapes into the surrounding atmosphere upon effecting the diffusion of said boron. In some embodiments, the cap layer is selected such that no more than 0.5% of boron in the boron-containing layer escapes into the surrounding atmosphere upon effecting the diffusion of said boron. In some embodiments, the cap layer is selected such that no more than 0.3% of boron in the boron-containing layer escapes into the surrounding atmosphere upon effecting the diffusion of said boron. In some embodiments, the cap layer is selected such that no more than 0.2% of boron in the boron-containing layer escapes into the surrounding atmosphere upon effecting the diffusion of said boron. In some embodiments, the cap layer is selected such that no more than 0.1% of boron in the boron-containing layer escapes into the surrounding atmosphere upon effecting the diffusion of said boron. In some embodiments, the cap layer is selected such that no more than 0.05% of boron in the boron-containing layer escapes into the surrounding atmosphere upon effecting the diffusion of said boron. In some embodiments, the cap layer is selected such that no more than 0.03% of boron in the boron-containing layer escapes into the surrounding atmosphere upon effecting the diffusion of said boron. In some embodiments, the cap layer is selected such that no more than 0.02% of boron in the boron-containing layer escapes into the surrounding atmosphere upon effecting the diffusion of said boron. In some embodiments, the cap layer is selected such that no more than 0.01% of boron in the boron-containing layer escapes into the surrounding atmosphere upon effecting the diffusion of said boron.

Without being bound by any particular theory, it is believed that escape of boron from a boron-containing layer during diffusion (e.g., diffusion effected by heating, according to any of the respective embodiments described herein) can deleteriously result in heterogeneous boron-doping, for example, in reduced boron-doping along the edge of a substrate surface (relative to boron-doping in the center of the substrate surface) due to a greater degree of boron escaping from the edge of the substrate.

In some embodiments, the cap layer is selected such that it reduces an amount of boron which diffuses into the first surface of the substrate upon effecting diffusion of boron according to any of the respective embodiments described herein (i.e., in comparison to an amount of boron which diffuses into the first surface, under the same conditions, in the absence of the cap layer).

In some embodiments, the cap layer is selected such that it reduces an amount of boron which diffuses into the first surface by at least 95%. In some embodiments, the cap layer is selected such that it reduces an amount of boron which diffuses into the first surface by at least 98%. In some embodiments, the cap layer is selected such that it reduces an amount of boron which diffuses into the first surface by at least 99%.

Without being bound by any particular theory, it is believed that escape of boron from a boron-containing layer during diffusion (e.g., diffusion effected by heating, according to any of the respective embodiments described herein) can deleteriously result in gaseous boron diffusing into the first surface (which is intended to be doped by the n-dopant), especially in embodiments which do not include removal of a first n-doped layer.

In some embodiments described herein relating to boron escape and/or diffusion into a first surface upon effecting diffusion of boron, the diffusion of boron is effected by exposure to an elevated temperature, for example, in a range of from 950° C. to 1050° C. (e.g., according to any of the respective embodiments described herein).

In some embodiments, forming each of the boron-containing layer and cap layer above the boron-containing layer (on the second surface of the substrate) is effected prior to forming the n-dopant-containing layer (on the first surface of the substrate). In some such embodiments, the cap layer (which is formed prior to the n-dopant-containing layer) is selected such that it reduces an amount of n-dopant (e.g., phosphorus) which diffuses into the second surface of the substrate upon effecting diffusion of the n-dopant and boron according to any of the respective embodiments described herein (i.e., in comparison to an amount of n-dopant which diffuses into the second surface, under the same conditions, in the absence of the cap layer). In some such embodiments, the cap layer is selected such that it reduces an amount of n-dopant which diffuses into the second surface by at least 90%. In some embodiments, the cap layer is selected such that it reduces an amount of n-dopant which diffuses into the second surface by at least 95%. In some embodiments, the cap layer is selected such that it reduces an amount of n-dopant which diffuses into the second surface by at least 98%. In some embodiments, the cap layer is selected such that it reduces an amount of n-dopant which diffuses into the second surface by at least 99%. In some embodiments, the cap layer is selected such that it reduces an amount of n-dopant which diffuses into the second surface by at least 99.5%. In some embodiments, the cap layer is selected such that it reduces an amount of n-dopant which diffuses into the second surface by at least 99.8%. In some embodiments, the cap layer is selected such that it reduces an amount of n-dopant which diffuses into the second surface by at least 99.9%. In some embodiments, the cap layer is selected such that it reduces an amount of n-dopant which diffuses into the second surface by at least 99.95%. In some embodiments, the cap layer is selected such that it reduces an amount of n-dopant which diffuses into the second surface by at least 99.99%.

Without being bound by any particular theory, it is believed that a cap layer formed (on the second surface) prior to an n-dopant-containing layer may serve as a barrier to n-dopant inadvertently contacting and/or diffusing into the second surface (which is intended to be doped by boron).

In some embodiments, the cap layer is formed such that a border of the cap layer corresponds to a desired border of an n-doped layer (according to any of the respective embodiments described herein). The cap layer may optionally determine the border of an n-doped layer by preventing n-doping across the border (i.e., in a region covered by the cap layer), for example, facilitating separation (i.e., reducing overlap) of an n-doped layer and a boron-doped layer, which can enhance shunt resistance.

In some embodiments described herein, forming the cap layer is effected such that the cap layer covers an edge of the substrate (i.e., a surface between the first surface and the second surface, which is optionally perpendicular to each of the first surface and second surface), and optionally covers all of the edges of the substrate. In some such embodiments, the cap layer prevents formation of an n-doped layer (according to any of the respective embodiments described herein) on an edge of the substrate.

It is to be understood that, unless otherwise defined, the operations described herein can be executed in many combinations or orders of execution. The ordering described herein is not to be considered as limiting. For example, two or more operations, appearing in the description in a particular order, can be executed in a different order (e.g., a reverse order) or substantially contemporaneously.

The Photovoltaic Cell:

According to some embodiments of the present invention there is provided a bifacial photovoltaic cell comprising a semiconductor substrate (e.g., silicon), the substrate comprising an $n^+$ layer on a first surface thereof and a $p^+$ layer on a second surface thereof, the $n^+$ layer comprising an n-dopant (e.g., phosphorus) and the $p^+$ layer comprising boron. Preferably, the photovoltaic cell further comprises electrical contacts on each of said first surface and said second surface, which are suitable for a bifacial cell (e.g., the contacts do not cover a large proportion of either surface). In some embodiments, the bifacial photovoltaic cell is prepared by a method described herein in any of the respective embodiments and any combination thereof.

In some embodiments described herein for a bifacial photovoltaic cell, a concentration of boron in a $p^+$ layer is less than $10^{21}$ atoms/cm$^3$, optionally less than $3 \cdot 10^{20}$ atoms/cm$^3$, optionally less than $10^{20}$ atoms/cm$^3$, optionally less than $3 \cdot 10^{19}$ atoms/cm$^3$ and optionally less than $10^{19}$ atoms/cm$^3$.

According to some embodiments, a specific shunt resistance of the photovoltaic cell is at least 5,000 ohm*cm$^2$ (i.e., ohm multiplied by cm$^2$), optionally at least 5,500 Ohm*cm$^2$, optionally at least 6,000 Ohm*cm$^2$, optionally at least 6,500 Ohm*cm$^2$, and optionally at least 7,000 Ohm*cm$^2$. As specific shunt resistance may depend on the area and shape of a photovoltaic cell, the aforementioned specific shunt resistance may be determined for a photovoltaic cell having an area of about 230 cm$^2$ and being substantially square (i.e., having a circumference of about 61 cm).

Without being bound by any particular theory, it is believed that known techniques for enhancing shunt resistance (e.g., laser edge isolation) are less effective (and even deleterious) in high-efficiency cells (such as cells with low controlled boron concentrations, as described herein).

In some embodiments described herein, a concentration of boron in a $p^+$ layer is less than $10^{21}$ atoms/cm$^3$, and a specific shunt resistance of the photovoltaic cell is at least 5,000 Ohm*cm$^2$. In some such embodiments, the specific shunt resistance is at least 5,500 Ohm*cm$^2$. In some such embodiments, the specific shunt resistance is at least 6,000 Ohm*cm$^2$. In some such embodiments, the specific shunt resistance is at least 6,500 Ohm*cm$^2$. In some such embodiments, the specific shunt resistance is at least 7,000 Ohm*cm$^2$.

In some embodiments described herein, a concentration of boron in a $p^+$ layer is less than $3 \cdot 10^{20}$ atoms/cm$^3$, and a specific shunt resistance of the photovoltaic cell is at least 5,000 Ohm*cm$^2$. In some such embodiments, the specific shunt resistance is at least 5,500 Ohm*cm$^2$. In some such embodiments, the specific shunt resistance is at least 6,000 Ohm*cm$^2$. In some such embodiments, the specific shunt resistance is at least 6,500 Ohm*cm$^2$. In some such embodiments, the specific shunt resistance is at least 7,000 Ohm*cm$^2$.

In some embodiments of a concentration of boron in a $p^+$ layer is less than $10^{20}$ atoms/cm$^3$, and a specific shunt resistance of the photovoltaic cell is at least 5,000 ohm*cm$^2$. In some such embodiments, the specific shunt resistance is at least 5,500 Ohm*cm$^2$. In some such embodiments, the specific shunt resistance is at least 6,000 Ohm*cm$^2$. In some such embodiments, the specific shunt resistance is at least 6,500 Ohm*cm$^2$. In some such embodiments, the specific shunt resistance is at least 7,000 Ohm*cm$^2$.

According to some embodiments, a concentration of boron in a $p^+$ layer is less than $3 \cdot 10^{19}$ atoms/cm$^3$, and a specific shunt resistance of the photovoltaic cell is at least 5,000 Ohm*cm$^2$. In some such embodiments, the specific shunt resistance is at least 5,500 Ohm*cm$^2$. In some such embodiments, the specific shunt resistance is at least 6,000 Ohm*cm$^2$. In some such embodiments, the specific shunt resistance is at least 6,500 Ohm*cm$^2$. In some such embodiments, the specific shunt resistance is at least 7,000 Ohm*cm$^2$.

In some embodiments described herein, a concentration of boron in a $p^+$ layer is less than $10^{19}$ atoms/cm$^3$, and a specific shunt resistance of the photovoltaic cell is at least 5,000 Ohm*cm$^2$. In some such embodiments, the specific shunt resistance is at least 5,500 Ohm*cm$^2$. In some such embodiments, the specific shunt resistance is at least 6,000 Ohm*cm$^2$. In some such embodiments, the specific shunt resistance is at least 6,500 Ohm*cm$^2$. In some such embodiments, the specific shunt resistance is at least 7,000 Ohm*cm$^2$.

In some embodiments the $p^+$ layer is characterized by a sheet resistance according to any of the respective embodiments described herein, e.g., in a range of from 15 to 300 Ohms, from 30 to 300 Ohms, from 30 to 200 Ohms and/or from 30 to 150 Ohms.

In some embodiments, the first surface is texturized.

In some embodiments described herein, the second surface is texturized. Optionally the first and second surfaces are both texturized.

In some embodiments of the present invention the photovoltaic cell further comprises a passivating and/or antireflective coating (according to any of the embodiments described herein) on at least a portion of the second surface, optionally the entire second surface. In some embodiments, the passivating and/or antireflective coating covers at least a portion of, and optionally all of, the edges of the substrate; and optionally covers a portion of the first surface bordering an edge of the substrate (e.g., an area of the first surface having a width of up to 0.5 mm, optionally from 0.1-0.5 mm, bordering the edge).

In some embodiments, the photovoltaic cell further comprising a passivating and/or antireflective coating (according to any of the embodiments described herein) on at least a portion of the first surface, optionally the entire first surface. In some embodiments, a passivating and/or antireflective coating covers at least a portion of each of the first surface and the second surface, and optionally the entire first surface and second surface. A passivating and/or antireflective coating on the first surface may be the same as, or different than a passivating and/or antireflective coating on the second surface.

In some embodiments, a total thickness of passivating coating(s) (according to any of the embodiments described herein) is in a range of from 1 to 15 nm, optionally in a range of from 2 to 15 nm, and optionally in a range of from 5 to 15 nm.

Examples of passivating and/or antireflective coatings according to any of the respective embodiments described herein include, without limitation, coatings comprising silicon nitride, silicon oxynitride, $TiO_2$, $ZrO_2$, and/or $Ta_2O_5$. When more than one layer is present in a passivating and/or antireflective coating, the different layers may differ, for example, in refractive index (e.g., an upper layer having a lower refractive index than a lower layer) and/or components (e.g., one layer comprising silicon oxynitride and another layer comprising silicon nitride).

In some embodiments an $n^+$ layer of the photovoltaic cell, a second $n^+$ layer prepared according to any of the respective embodiments described herein, is characterized by a sheet resistance in a range of from 70 to 150 Ohms.

In some embodiments a concentration of boron in a $p^+$ layer (according to any of the respective embodiments described herein) is greater in regions underlying said electrical contacts on said second surface. In some embodiments, a concentration of boron in regions underlying said electrical contacts is at least 20% greater than a concentration of boron in the rest of the $p^+$ layer. In some embodiments, a concentration of boron in regions underlying said electrical contacts is at least 40% greater than a concentration of boron in the rest of the $p^+$ layer. In some embodiments, a concentration of boron in regions underlying said electrical contacts is at least 60% greater than a concentration of boron in the rest of the $p^+$ layer. In some embodiments, a concentration of boron in regions underlying said electrical contacts is at least 80% greater than a concentration of boron in the rest of the $p^+$ layer. In some embodiments, a concentration of boron in regions underlying said electrical contacts is at least 100% (twice) greater than a concentration of boron in the rest of the $p^+$ layer. In some embodiments, a concentration of boron in regions underlying said electrical contacts is at least 200% (3-fold) greater than a concentration of boron in the rest of the $p^+$ layer. In some embodiments, a concentration of boron in regions underlying said electrical contacts is at least 400% (5-fold) greater than a concentration of boron in the rest of the $p^+$ layer. In some embodiments, a concentration of boron in regions underlying said electrical contacts is at least 900% (10-fold) greater than a concentration of boron in the rest of the $p^+$ layer.

In some embodiments the photovoltaic cell further comprises a SiB layer on the second surface, optionally a SiB layer prepared according to any of the respective embodiments described herein. The SiB layer may optionally be a passivating coating according to any of the respective embodiments described herein.

According to some embodiments of the present invention, a $p^+$ layer (according to any of the respective embodiments described herein) is characterized by a sheet resistance of at least 15 Ohms/$\square$. In some embodiments, the sheet resistance of a $p^+$ layer is in a range of from 15 to 300 Ohms/$\square$. In some embodiments, the sheet resistance of a $p^+$ layer is in a range of from 15 to 200 Ohms/$\square$. In some embodiments, the sheet resistance of a $p^+$ layer is in a range of from 15 to 150 Ohms/$\square$.

In some embodiments, a $p^+$ layer (according to any of the respective embodiments described herein) is characterized by a sheet resistance of at least 30 Ohms/$\square$. In some embodiments, the sheet resistance of a $p^+$ layer is in a range of from 30 to 300 Ohms/$\square$. In some embodiments, the sheet resistance of a $p^+$ layer is in a range of from 30 to 200 Ohms/$\square$. In some embodiments, the sheet resistance of a $p^+$ layer is in a range of from 30 to 150 Ohms/$\square$.

According to some embodiments, a $p^+$ layer of the photovoltaic cell does not cover an area bordering an edge of the substrate thereof, the area having a width in a range of 0.1-0.5 mm Such an area may optionally be prepared by masking and/or etching the second surface, according to any of the respective embodiments described herein.

In any of the embodiments described herein (according to any of the aspects described herein), the semiconductor substrate comprises silicon, and optionally consists essentially of doped silicon (e.g., p-type or n-type silicon).

In any of the embodiments described herein (according to any of the aspects described herein), the semiconductor substrate may optionally be an n-type semiconductor (e.g., n-doped silicon), such that the photovoltaic cell has a $p^+$-n-$n^+$ structure; or a p-type semiconductor (e.g., p-doped silicon), such that the photovoltaic cell has a $n^+$-p-$p^+$ structure.

In some embodiments described herein, an effective back surface recombination of the photovoltaic cell (according to any of the respective embodiments described herein) is less than 150 cm/second. In some embodiments, the effective back surface recombination is less than 100 cm/second. In some embodiments, the effective back surface recombination is less than 60 cm/second. In some embodiments, the effective back surface recombination is less than 30 cm/second. In some embodiments, the effective back surface recombination is less than 20 cm/second. In some embodiments, the effective back surface recombination is less than 10 cm/second. In some embodiments, the effective back surface recombination is less than 5 cm/second.

Effective surface recombination (e.g., of the back surface) may be determined according to any suitable technique known in the art, for example, by measuring spectral internal quantum efficiency upon illumination (e.g., of the back side). Optionally, effective surface recombination is determined as described in Eisenberg et al. [*Energy Procedia* 2016, 92:16-23], the contents of which are incorporated herein by reference (especially contents relating to measurement of surface recombination).

In some embodiments, a front side efficiency of the photovoltaic cell (according to any of the respective embodiments described herein) is at least 19%. In some embodiments, the front side efficiency is at least 19.5%. In some embodiments, the front side efficiency is at least 20%. In some embodiments, the front side efficiency is at least 20.5%. In some embodiments, the front side efficiency is at least 21%. In some embodiments, the front side efficiency is at least 21.5%. In some embodiments, the front side efficiency is at least 22%.

Herein, the phrase "front side efficiency" refers to efficiency (as described herein) of the photovoltaic cell under conditions wherein only one (front) side of the cell is exposed to illumination (e.g., wherein the other side is placed on a black opaque surface). The "front side" exposed to illumination is defined as whichever side is characterized by the higher efficiency.

The efficiency of a cell (e.g., with respect to illumination of any given side thereof) may be determined by determining the maximal power output of the cell, and dividing by the input light irradiance, at standard test conditions.

In some embodiments described herein, an open circuit voltage of the photovoltaic cell (according to any of the respective embodiments described herein) is at least 620 mV. In some embodiments, the open circuit voltage is at least 630 mV. In some embodiments, the open circuit voltage is at least 640 mV. In some embodiments, the open circuit voltage is at least 650 mV. In some embodiments, the open circuit voltage is at least 660 mV. In some embodiments, the open circuit voltage is at least 670 mV.

Physical parameters described herein relating to photovoltaic cell performance are determined by measurements at standard test conditions used in the art to evaluate photovoltaic cells. Standard test conditions include solar irradiance of 1,000 W/m$^2$, solar reference spectrum at AM (air mass) of 1.5 and a cell temperature 25° C.

In some embodiments, a ratio of back side short circuit current to front side short circuit current is at least 0.75. In some embodiments, the ratio of back side short circuit current to front side short circuit current is at least 0.8. In some embodiments, the ratio of back side short circuit current to front side short circuit current is at least 0.85. In some embodiments, the ratio of back side short circuit current to front side short circuit current is at least 0.9.

Herein, the phrase "front side short circuit current" refers to short circuit current (as described herein) of the photovoltaic cell under conditions wherein only the front side of the cell is exposed to illumination (e.g., wherein the back side is placed on a black opaque surface), and the phrase "back side short circuit current" refers to short circuit current (as described herein) of the photovoltaic cell under conditions wherein only the back side of the cell is exposed to illumination (e.g., wherein the front side is placed on a black opaque surface). The "front side" is defined as whichever side is characterized by the higher efficiency and the "back side" is defined as whichever side is characterized by the lower efficiency (determined as described herein).

Short circuit current ($I_{SC}$) may be determined, for example, by measuring the current produced by the photovoltaic cell at short circuit (i.e., voltage=0) using standard techniques of the art.

As the back side is (by definition) less efficient than the front side, a ratio of back side short circuit current to front side short circuit current is typically less than 1, optionally less than 0.95.

Without being bound by an particular theory, it is believed that a relatively high ratio of back side short circuit current to front side short circuit current (e.g., as described herein) is associated with a superior rear side design (e.g., the $p^+$ layer in a $p^+$-p-$n^+$ structure), characterized by reduction and even elimination of over-doping, and/or low effective back side recombination. It is further believed that values of other parameters described herein, such as relatively high front side efficiency, may also be improved by a superior rear side design.

According to another aspect of embodiments of the invention, there is provided a photovoltaic module comprising a plurality of any of the photovoltaic cells described herein, the photovoltaic cells being interconnected to one another.

As used herein, the phrase "photovoltaic module" describes a module comprising an array of photovoltaic cells, which are interconnected in series and/or in parallel. Connection of the cells in series creates a higher voltage. Connection of the cells in parallel results in a higher current. Thus, a skilled artisan can connect the cells in a manner which will provide a desired voltage and current.

The module may optionally further combine additional elements such as a sheet of glass to protect the photovoltaic cell from the environment without blocking light from reaching the photovoltaic cell and/or a base which orients the module in the direction of a source of light (e.g., for tracking the daily movement of the sun). Optionally, an inverter is present in order to convert the direct current to alternating current. A battery is optionally present in order to store energy generated by the photovoltaic cell.

According to another aspect of embodiments of the present invention, there is provided a power plant comprising the photovoltaic modules described herein. The power plant optionally comprises a plurality of photovoltaic modules positioned so as to maximize their exposure to sunlight.

It is to be appreciated that an optimal position and orientation of a photovoltaic module including the bifacial photovoltaic cells described herein may be different than an optimal position of an array of monofacial photovoltaic cells.

According to another aspect of embodiments of the present invention, there is provided an electric device comprising a photovoltaic cell according to any of the respective embodiments described herein. The electric device may be configured such that both sides of the bifacial photovoltaic cell are exposed to light (e.g., being at a surface of the device). In some embodiments, the photovoltaic cells are a power source for the electric device.

Exemplary applications of the photovoltaic cells and/or photovoltaic modules described herein include, but are not limited to, a home power source, a hot water heater, a pocket computer, a notebook computer, a portable charging dock, a cellular phone, a pager, a PDA, a digital camera, a smoke detector, a GPS device, a toy, a computer peripheral device, a satellite, a space craft, a portable electric appliance (e.g., a portable TV, a portable lighting device), and a cordless electric appliance (e.g., a cordless vacuum cleaner, a cordless drill and a cordless saw).

According to another aspect of embodiments of the present invention, there is provided a detector of electromagnetic radiation, the detector comprising any photovoltaic cell described herein, wherein the electromagnetic radiation is selected from the group consisting of ultraviolet, visible and infrared radiation. The detector may be used, for example, in order to detect the radiation (e.g., as an infrared detector) and/or to measure the amount of radiation (e.g., in spectrophotometry).

It is expected that during the life of a patent maturing from this application many relevant doping techniques will be developed and the scope of the term "doping" are intended to include all such new technologies a priori.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non-limiting fashion.

Example 1

Effect of Cap Layer on p+-Layer Formation

Cz n-type silicon wafers having a resistivity of approximately 5 Ω·cm were chosen as substrates. Boron-containing surface sources were deposited on the surface of polished silicon substrates by radio frequency (RF) sputtering of a boron nitride (BN) target. Argon with addition of oxygen was used as sputtering ions. Depending on concentration of oxygen in the sputtering gas, BN or $BO_xN_y$ layers were formed with thicknesses in a range of 1-10 nm.

Boron-containing layers prepared as described hereinabove were protected prior to diffusion processing, by forming SiN and/or $SiO_x$ cap layers of 5 to 20 nm thicknesses by sputtering. Diffusion in a quartz tube furnace at a temperature of 1025° C. was undertaken with the wafers disposed in a stack, to form a boron-doped p+ layer in the silicon substrate.

As shown in FIG. 1, diffusion for 30 minutes following formation of 5 or 10 nm SiN capping layer resulted in boron-doped p+ layers in the silicon characterized by relatively low scattering of sheet resistance ($R_{sh}$) values for a given thickness of boron-containing layer sputtered on the silicon surface (including sputtering at an oxygen flow rate of 20 cm³/minute.

The scattering in $R_{sh}$ values was lower than in samples without a cap layer (data not shown), indicating that the cap layer reduces scattering and enhances reproducibility.

Example 2

Photovoltaic Cell Structures are Prepared by Covering a Boron-Containing Layer with a Cap Layer and Following Simultaneous Diffusion of Boron and Phosphorous in POCl₃ Containing Gas p-type Cz silicon wafers with resistivity of ~5 Ohm·cm with minority carriers lifetime above 0.5 ms are used for the experiment. Boron containing layers of different thicknesses are applied on a rear side of the wafers. The SiN cap layers of 40 nm thickness were applied over the boron-containing layers using sputtering technique. Boron diffusion was provided in the wafers installed in the gas flow containing POCl₃ at the temperatures 850-1020° C. Phosphorous doped n+-layer is removed upon texturing of the front side by etching (e.g., as described in Russian Patent No. 2139601). A p-n junction is formed by phosphorus diffusion (e.g., via POCl₃ diffusion) to form a second n+ layer, after an antireflective layer (e.g., silicon nitride) is deposited on the boron-doped side. Solar cell structures are finished by antireflective SiN layers deposition on the cell front.

Implied open circuit voltage, $iV_{oc}$, measured using Quasi Steady State Photoconductivity Decay (QSSPCD) technique. The measurement tool was WCT-120 Silicon Wafer Lifetime Tester (Sinton Consulting Inc.). Table 1 reflects the results of measurements of solar cell structures with sheet resistivity of n+-layer 120 Ohm/□ and different sheet resistivity values of p+-layer. The data shown in the table, demonstrate the high recombination quality of the structures, fabricated according to described technology.

TABLE 1

Experimentally determined $iV_{oc}$ values for differently back doped solar cell structures.

| | p+ layer sheet resistance, $R_{sh}$, Ω/□ | | | | |
|---|---|---|---|---|---|
| | 57 | 80 | 100 | 125 | 155 |
| Implied open circuit voltage, $V_{oc}$, mV | 694-699 | 694-701 | 696-703 | 695-702 | 697-704 |

Figure 2:
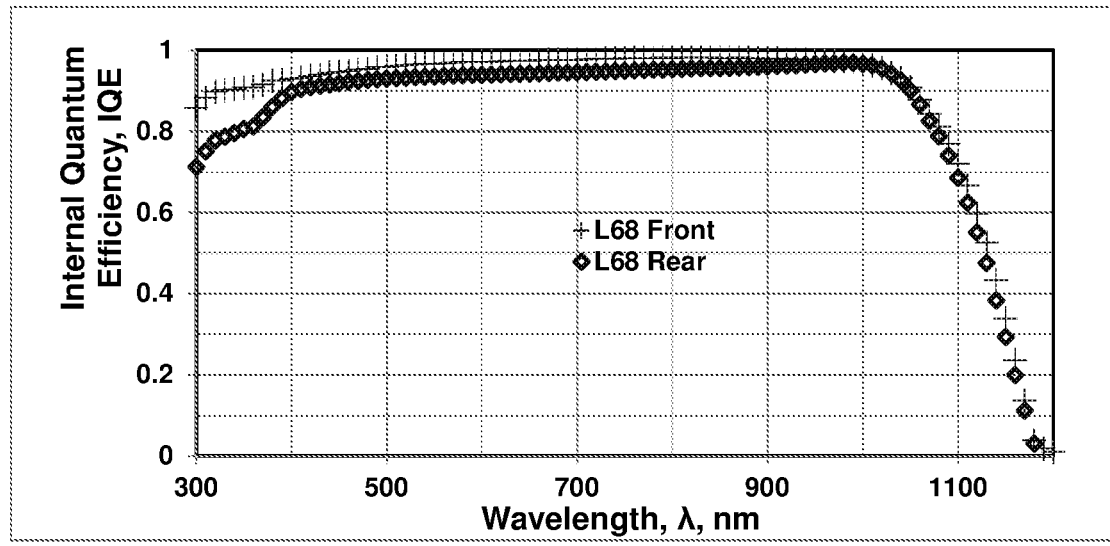
FIG. 2 is a graph showing front and back wavelength dependences of Internal Quantum Efficiency, IQE, for typical bifacial cell fabricated by simultaneous P deposition/P diffusion/B diffusion in gas phase containing $POCl_3$.

The same conclusions can be made based on front and back internal quantum efficiencies, IQE, data shown in FIG. 2. The IQE were measured for the above structures after front and back contact grids printing. The curves are typical for the samples prepared in the experiment.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

The invention claimed is:

1. A method of producing a bifacial photovoltaic cell, the method comprising:
   a) forming a boron-containing layer on a second surface of a semiconductor substrate;
   b) forming a cap layer above the boron-containing layer; and:
   c) effecting simultaneously:
      deposition of a phosphorous-containing layer on a first surface of the semiconductor substrate, using POCl₃ vapors as a component of gaseous phase surrounding the semiconductor substrate;
      phosphorous diffusion in the above gaseous atmosphere from the phosphorous containing layer into the substrate to form an n-doped layer; and:
      diffusion of the boron from said boron-containing layer into the semiconductor substrate to form a p+-layer.

2. The method of claim 1, wherein forming said cap layer is effected by depositing a substance selected from the group consisting of silicon oxide, silicon nitride and silicon oxynitride.

3. The method of claim 1, further comprising:
   d) removing the n-doped layer from said semiconductor substrate by texturizing;
   e) forming a passivating and/or antireflective coating on said second surface; and
   f) subsequently doping said first surface with an n-dopant, optionally phosphorous.

4. The method according to claim 3, further comprising removing said cap layer subsequently to removing said n-doped layer on said first surface by texturizing, and prior to forming said passivating and/or antireflective coating.

5. The method according to claim 3, wherein said subsequently doping said first surface with an n-dopant forms an n⁺ layer characterized by a sheet resistance in a range of 70-150 Ohm/sq.

6. The method of claim 1, wherein said cap layer is selected such that it reduces by at least 90% a degree of oxidation of said boron-containing layer upon exposure to air; and/or reduces by at least 90% a degree of water absorption by said boron-containing layer upon exposure to air; and/or no more than 5% of boron in said boron-containing layer escapes into the surrounding atmosphere upon effecting said diffusion of said boron; and/or reduces by at least 95% an amount of boron which diffuses into said first surface of said substrate upon effecting said diffusion of said boron.

7. The method of claim 1, wherein diffusion of said boron from the boron-containing layer is effected by exposure to a temperature in a range of from 850° C. to 1050° C.

8. The method of claim 1, wherein said cap layer is selected such that it reduces by at least 99% an amount of said n-dopant which diffuses into said second surface of the semiconductor substrate upon said diffusion of said n-dopant and said boron.

9. The method of claim 1, wherein forming said boron-containing layer on said second surface is effected by a technique selected from the group consisting of ion implantation, sputtering, chemical vapor deposition and physical vapor deposition.

10. The method of claim 1, further comprising forming electrical contacts on each of said first surface and said second surface.

11. The method of claim 1, wherein said semiconductor substrate is selected from among a p-type semiconductor or an n-type semiconductor, and optionally said semiconductor substrate comprises silicon.

12. The method of claim 1, wherein a thickness of said boron-containing layer is in a range of from 1 to 80 nm.

13. The method of claim 1, wherein said boron-containing layer and conditions of said diffusion are selected such that a surface concentration of boron in said second surface is less than $3 \cdot 10^{20}$ atoms/cm³; and/or said boron-containing layer and conditions of said diffusion are selected such that doping said second surface with boron forms a p⁺ layer characterized by a thickness in a range of from 0.3 to 1.5 μm; and/or said boron-containing layer and conditions of said diffusion are selected such that doping said second surface with boron forms a p⁺ layer characterized by a sheet resistance in a range of from 30 to 150 Ohms/sq.

14. A bifacial photovoltaic cell prepared according to a method comprising:
a) forming a boron-containing layer on a second surface of a semiconductor substrate;
b) forming a cap layer above the boron-containing layer; and
c) effecting simultaneously:
deposition of a phosphorous-containing layer on a first surface of the semiconductor to form an n-doped layer, using POCl₃ vapors as a component of gaseous phase surrounding the semiconductor substrate,
Phosphorous diffusion from the phosphorous containing layer into the substrate to form an n-doped layer,
diffusion of the boron from said boron-containing layer into the semiconductor substrate to form a p⁺-layer.

15. The photovoltaic cell of claim 14, wherein said method further comprises:
d) removing said n-doped layer from the substrate by texturizing;
e) forming a passivating and/or antireflective coating on said second surface; and
f) subsequently doping said first surface with an n-dopant, optionally phosphorous, and
optionally removing said cap layer and boron-containing layer prior to forming a passivating and/or antireflective coating.

16. The photovoltaic cell of claim 9, wherein said n⁺ doped layer is characterized by a sheet resistance in a range of from 70 to 150 Ohm/sq.

17. The photovoltaic cell of claim 9, wherein said method further comprises:
forming electrical contacts on each of said first surface and said second surface.

18. The photovoltaic cell of claim 8, wherein said semiconductor substrate is a p-type semiconductor or n-type semiconductor; and optionally said semiconductor substrate comprises silicon.

19. The photovoltaic cell of claim 9, wherein said p⁺ layer is characterized by a sheet resistance in a range of from 30 to 150 Ohm/sq.

20. The photovoltaic cell of claim 9, wherein an effective back surface recombination of the photovoltaic cell is less than 50 cm/second.

21. The photovoltaic cell of claim 9, claim characterized by a front side efficiency of at least 19%.

22. The photovoltaic cell of claim 9, wherein a ratio of back side short circuit current to front side short circuit current is at least 0.8.

* * * * *